United States Patent [19]

Melzer et al.

[11] Patent Number: 5,655,859
[45] Date of Patent: Aug. 12, 1997

[54] MACHINE TOOL

[75] Inventors: Rainer Melzer; Roland Melzer, both of Schwelm, Germany

[73] Assignee: Melzer maschinenbau GmbH, Schwelm, Germany

[21] Appl. No.: 523,027

[22] Filed: Sep. 1, 1995

[30] Foreign Application Priority Data

Sep. 16, 1994 [DE] Germany .............. 44 33 076.6

[51] Int. Cl.$^6$ ...................................... B23C 1/08
[52] U.S. Cl. .................. 409/132; 409/137; 409/191; 409/192; 409/209
[58] Field of Search ............... 409/191, 192, 409/137, 235, 185, 190, 203, 209, 213, 132, 131; 408/42, 46, 53

[56] References Cited

U.S. PATENT DOCUMENTS

| | | | |
|---|---|---|---|
| 2,951,425 | 9/1960 | Eger | 409/203 |
| 3,749,507 | 7/1973 | Haley | 408/46 |
| 3,765,787 | 10/1973 | Hart et al. | 408/53 |
| 4,102,592 | 7/1978 | Mackinder | 408/46 |
| 4,382,728 | 5/1983 | Anderson et al. | 409/137 |
| 4,634,322 | 1/1987 | Walker | 409/138 |

FOREIGN PATENT DOCUMENTS

| | | |
|---|---|---|
| 0 589 771 | 3/1994 | European Pat. Off. . |
| 1477872 | 9/1969 | Germany ............ 408/46 |
| 39 19 138 | 8/1990 | Germany . |

Primary Examiner—Daniel W. Howell
Attorney, Agent, or Firm—Townsend and Townsend and Crew LLP

[57] ABSTRACT

A machine tool comprises a spindle head displaceable in two orthogonal directions. The spindle head supports a plurality of main spindles and at least one common central driving gear. The spindle head is suspended by means of three flexible rods and a stationary main drive motor is coupled to the driving gear via a flexible shaft.

To be used for milling recesses into plastic cards, the recesses being dimensioned to receive electronic chips.

17 Claims, 3 Drawing Sheets

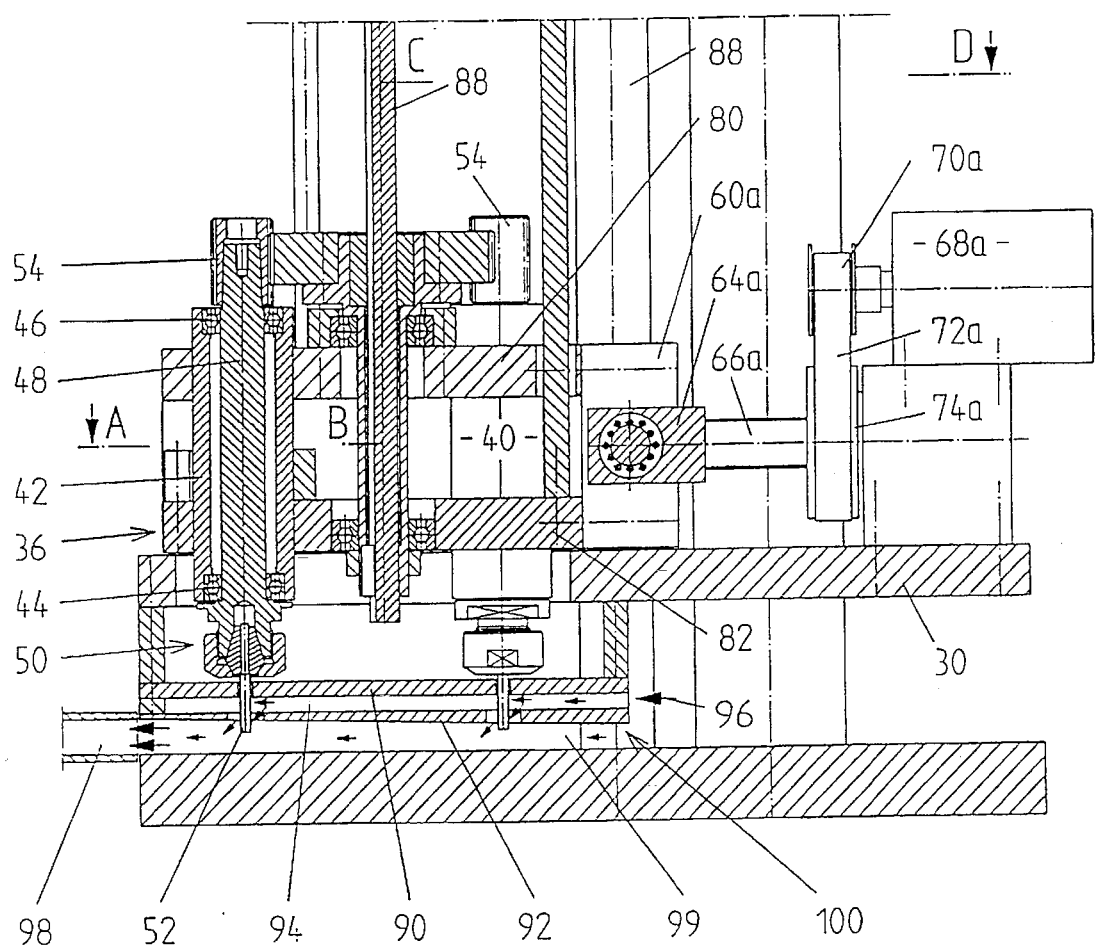

MACHINE TOOL

BACKGROUND OF THE INVENTION

The present invention relates to a machine tool and in particular a milling machine. The invention provides a milling machine which is particularly suited for milling recesses into plastic cards which recesses must have standard dimensions to receive an electronic chip. Such recesses must exhibit high precision. Simultaneously, the machine must have a high productivity adapted to that of other stations of a chip card production. It is to be noted, however, that the machine tool of the present invention is not limited to the aforementioned application.

It is an object of the present invention to provide a machine tool having small masses to be accelerated and decelerated.

It is a further object of the present invention to provide a machine tool having a well-defined rest position of the tool.

SUMMARY OF THE INVENTION

To achieve these objects, the machine tool according to the present invention comprises at least one main spindle rotatably journalled in a spindle head. The spindle head is displaceable in three orthogonal directions X, Y, Z and the spindle axis extends in direction Z. The spindle carries a chuck for receiving a milling tool. A stationary frame supports a spindle drive motor spaced in Z direction from the spindle head. Further, the machine comprises means for supporting said spindle head on said frame. A base plate suspended on said frame is displaceable in Z direction in common with the spindle head which, in turn, is displaceably guided in X and Y directions relative to the base plate.

A preferred embodiment of the invention is illustrated in the attached drawings and will be described in detail hereunder.

BRIEF DESCRIPTION OF THE DRAWINGS

FIG. 3 is a section view according to line E-F-G-J of FIG. 2.

DESCRIPTION OF THE SPECIFIC EMBODIMENTS

Figure 1:
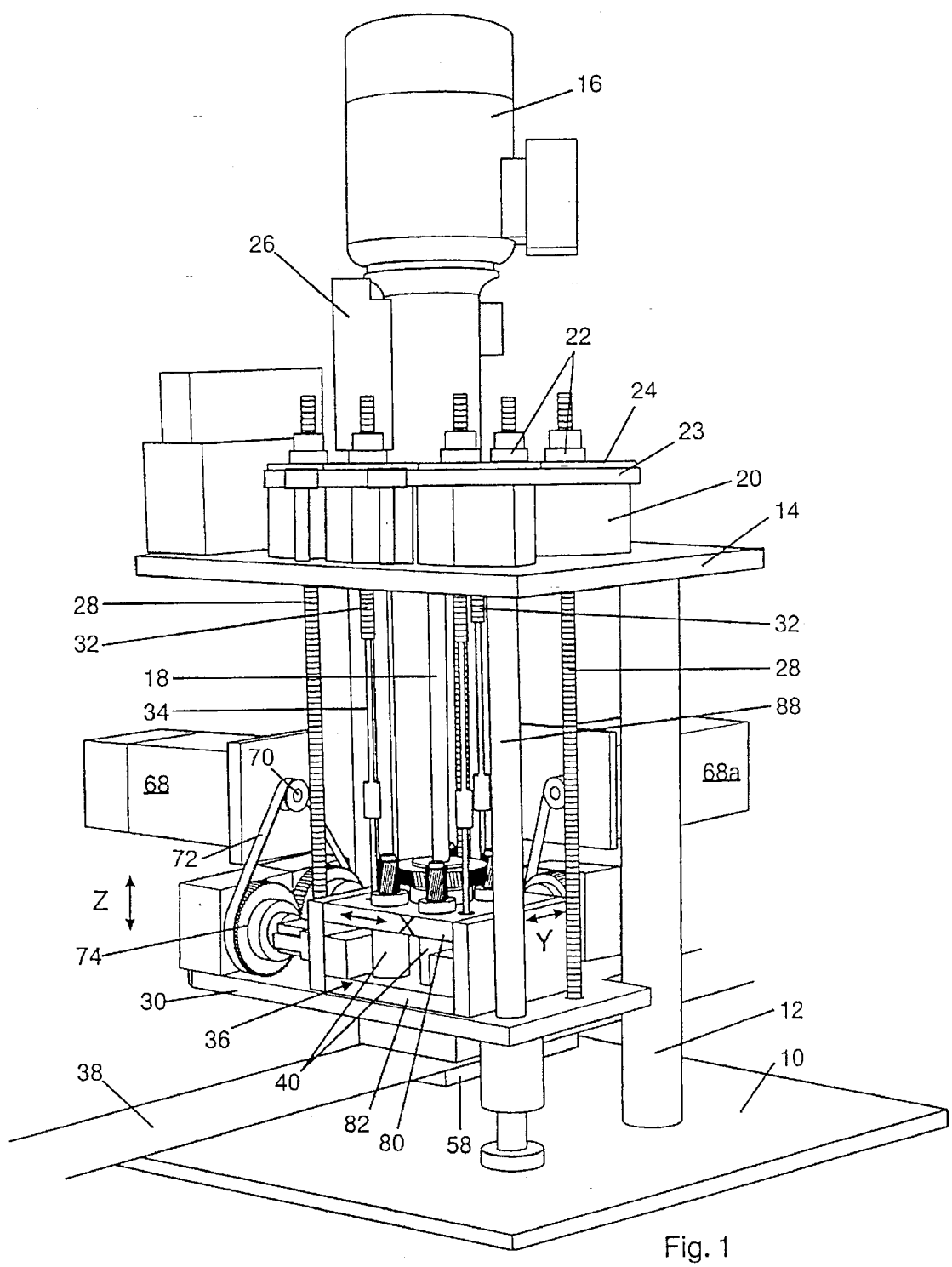
FIG. 1 is a perspective view of the machine.
Figure 2:
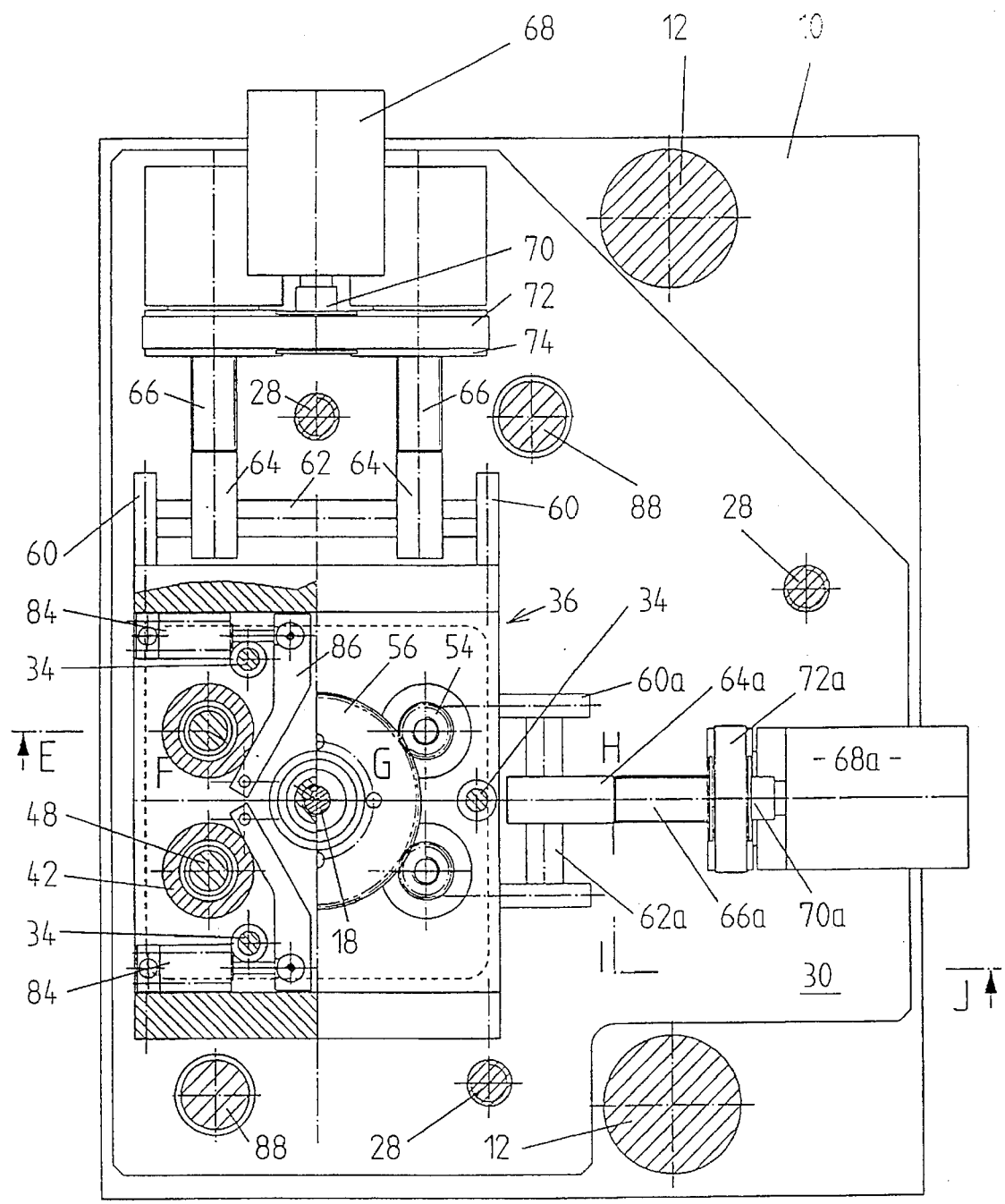
FIG. 2 is a section view according to line A-B-C-D of FIG. 3.

Referring first to FIG. 1, a support plate 10 carries a number of columns 12 of which one only is illustrated in FIG. 1. The columns 12 carry a top plate 14. The components 10, 12, and 14 form a stationary frame. A spindle drive motor 16 is mounted on top plate 14. An output shaft 18 of motor 16 is coupled to the main spindle in a manner to be described later. Further, top plate 14 supports six bearing blocks 20. A threaded nut is axially supported and rotatably received in each of the bearing blocks 20. Each nut has a pinion 24, and a toothed belt (not shown) couples all these pinions to be driven in the same sense and with identical speed by a Z-motor 26.

A non-rotatable threaded shaft is screwed into each of the nuts 24. Three of these shafts, designated 28, suspend a base plate 30. The other three, designated 32, are each connected to a flexible rod 34; the other ends of rods 34 are rigidly fixed to a spindle head 36.

Rods 34 have the primary purpose to carry the weight of spindle head 36. In addition, they provide a restoring force which contributes to accelerations and decelerations upon power-driven deflections of spindle head 36 in X and Y directions, the directions X, Y, and Z are indicated by respective arrows in the drawing. Three rods are provided in order to define three points of a plane of spindle head 36. Spindle head 36 is maintained non-rotatable in a manner to be described later. It is to be noted that the suspension rods 34 may be replaced with other means known to an expert skilled in the art, for example, a cross table supported by ball bearings.

Spindle head 36 supports at least one main spindle. In the illustrated embodiment, four such main spindles are provided which are of identical design and therefore all marked 40. It is to be noted, however, that less than four or, more likely, more than four main spindles may be supported by the spindle head, the drives of all main spindles being coupled to one another by means of gears.

Each main spindle comprises a bearing sleeve 42, and the spindle shaft 48 is journalled therein by means of roller bearings 44, 46 as may be seen in FIG. 3. A chuck 50 is mounted on the bottom end of spindle shaft 48 for receiving a tool 52, e.g. a single-tooth milling tool. A pinion 54 is mounted on the top end of spindle shaft 48. All four pinions 54 are in engagement with a common driving toothed wheel or gear 56. The materials of the pinions and of gear 56, respectively, are selected such that little or no lubrication will be necessary. For example, steel pinions may be paired with a plastic gear. This is true for the present embodiment where the torque to be transmitted is low but the risk of contamination of the work pieces must be avoided under all circumstances.

Toothed wheel 56 is driven by main spindle drive motor 16 via its output shaft 18. This output shaft is generally designated as a "flexible shaft" because its bottom end, coupled to gear 56, must be able to follow deflections in X and Y directions while its top end is stationary. The term "flexible" is intended to include shafts which are physically bent but also all known forms of shafts which, in operation, tolerate misalignment of the shaft ends, e.g. universal-joint shafts. The selection of an appropriate design will depend upon the intended use of the machine, in particular upon the torques to be transmitted.

Spindle head 36 carries a first pair of side plates 60, and a first cylindrical guide bar 62 extends between these side plates parallel with respect to the Y axis. Coupling members 64 are slidably displaceable along bar 62 on which they are supported by roller bearings, not shown. The coupling members are in addition displaceable in X direction by means of a toothed wheel (not shown) which cooperates with a worm 66 which is preferably a ball shaft. The two worms 66 are rotated through equal angles by an X-motor 68 via its output pinion 70, toothed belt 72 and gears 74. The assembly just described longitudinally guides spindle head 36 and prevents any rotation thereof about the Z axis.

Similarly, displacement in Y direction is provided: A pair of side plates 60a, guide bar 62a, coupling member 64a (only one is necessary here) and associated worm 66a, Y-motor 68a, pinion 70a, toothed belt 72a and gear 74a are provided for this purpose. X-motor, Y-motor, and Z-motor could be CNC controlled. However, this restrains the speed of operation. It is possible, to facilitate control by using guide curves or cams cooperating with cam followers in combination with limit switches provided that always the same shape is to be milled as in the case of chip-receiving recesses in plastic cards.

Spindle head 36 comprises a top plate 80 and a bottom plate 82. Plates 80, 82 have aligned apertures each receiving one of the main spindles 40. The bearing sleeves 42 of the main spindles are slidably mounted in the apertures so that their position in Z direction is adjustable; it is to be noted that the axial dimension of pinions 54 exceeds that of driving gear 56 thereby defining the range of height adjustment. In use, the bearing sleeves 42 must, of course, be axially fixed. For this purpose, a clamping system is provided comprising a pneumatic cylinder 84 whose piston rod is coupled to a clamping jaw 86 which, upon actuation of cylinder 84, presses one of the main spindles against top plate 80 and bottom plate 82 of spindle head 36.

If e.g. a tool or a main spindle is to be exchanged base plate 30 may be lifted by means of screw shafts 28 along guiding columns 88 simultaneously with spindle head 36 driven via the threaded portions 32 of rods 34. The main spindles may then be released and removed downwards, with panels 90 and 92—to be described later—being disassembled and removed. This design permits a simple setting-up of the machine. If, as in the present embodiment, four recesses are to be milled simultaneously into four plastic cards, at first the four one-tooth milling tools are coarsely positioned in the chuck of their main spindle. With the bearing sleeves being released but adjustably held in place by friction between pinion 54 and toothed gear 56, the spindle head is lowered towards the plastic card material until all four tools abut the surface of the plastic material. The spindles are now clamped, and the displacement in Z-direction will then take place with the plastic material surface as a reference plane.

It will be understood that upon deflections in X and Y direction a displacement in Z direction (upwards) will occur, too, because of the flexible rods 34. When milling recesses in plastic cards, this is not a drawback because then the glue used to fix the chip in the recess will flow inwards. In other applications, however, such a Z error would have to be compensated by controlled opposite displacement in Z direction, the size of which being experimentally determined or calculated.

As indicated above, in the present application of the machine tool it is of utmost importance to avoid any contamination of the machine and of the workpieces. In particular, care must be taken that the milling chips are not transported out of the machine together with the workpieces. For this purpose, a unique suction system is provided.

The shafts of tools 52 extend through narrow apertures of a protection panel 90 and through relatively much wider apertures of a guide panel 92 disposed beneath protection panel 90. The cavity 94 defined between the panels is closed at one end (left in FIG. 3); into the other end, pressurized air is blown by means of a blower indicated by arrow 96. The air passes through the apertures of panel 92 thereby cooling the tools and the workpieces. The space 99 beneath the guide panel 92 is connected to the inlet 98 of a vacuum source opposite blower 96. It is to be noted that the guide panel 92 gradually decreases in thickness so that the inlet 100 of space 99 has a smaller inflow section than inlet 98. In result, there is a pressure gradient from inlet 100 towards inlet 98 so that air flow is possible only in the direction indicated by the arrows and all chips are removed.

For sake of completeness, attention is drawn to the plastic card web 38 illustrated in FIG. 1. The web is held by means of a cooled suction plate 58 where it is milled, and positioned by means of aligning pins, not shown.

What is claimed is:

1. A machine tool, comprising:
   at least one main spindle rotatably journalled in a spindle head, the spindle head being displaceable in three orthogonal directions X, Y, Z and the spindle axis extending in direction Z, the spindle carrying a chuck for receiving a milling tool,
   a stationary frame which supports a spindle drive motor spaced in Z direction from said spindle head,
   means for supporting said spindle head on said frame,
   a base plate suspended on said frame, said base plate and said spindle head being commonly displaceable in Z direction, said spindle head being displaceably guided in X and Y directions relative to said base plate.

2. A machine tool comprising:
   a stationary frame defining orthogonal directions X, Y, and Z;
   a base plate suspended from the frame and displaceable in the Z direction;
   a spindle head mounted on the frame and displaceable in the X, Y, and Z directions, wherein the spindle head and base plate are commonly displaceable in the Z direction and the spindle head is displaceably guided in the X and Y directions relative to said base plate;
   at least one main spindle rotatably journalled along the Z axis in the spindle held;
   a chuck for receiving a milling tool carried on the main spindle; and
   a spindle drive motor supported on the stationary frame and aligned over the spindle head in the Z direction.

3. The machine tool of claim 19 further comprising at least three flexible rods extending in the Z direction, wherein the spindle head is suspended on the frame by said rods.

4. The machine tool of claim 2 or 3 further comprising at least two drive motors for displacing said spindle head in the X and Y directions, respectively.

5. The machine tool of claim 2 or claim 3 further comprising a flexible shaft which couples the spindle drive motor to the spindle.

6. The machine tool of claim 2 or claim 3 further comprising a plurality of main spindles disposed in said spindle head, wherein a flexible shaft couples the spindle drive motor to all spindles.

7. The machine tool of claim 2 or claim 3 further comprising threaded shafts which support the spindle head and said base plate so that they are commonly displaceable in the Z direction.

8. The machine tool of claim 7 comprising a single Z-displacement motor coupled to all rods by belts.

9. The machine tool of claim 7 wherein said base plate is suspended on said frame by means of three threaded shafts.

10. The machine tool of claim 3 wherein the rods are threaded thereby permitting common displacement of said base plate and spindle head.

11. The machine tool of claim 7 further comprising a single Z-displacement motor coupled to all threaded shafts by belts.

12. The machine tool of claim 2 wherein each main spindle comprises a bearing sleeve rotatably receiving the spindle, said bearing sleeve being releasably clamped on said spindle head by a clamping jaw and displaceable in Z direction when unclamped.

13. The machine tool of claim 2 further comprising a chip suction apparatus connected to a space beneath said base plate.

14. The machine tool of claim 13 wherein said chip suction apparatus includes:

a protection panel beneath said spindle and having a relatively small aperture through which a tool shaft may extend;

a guide panel beneath said protection panel and having a relatively large aperture for such tool shaft; and a suction outlet beneath said guide panel and opposite a cooling air inlet, said suction outlet being connected to a vacuum source.

15. The machine tool of claim 2 with a plurality of main spindles wherein each spindle chuck receives a tool for milling chip-receiving recesses into plastic cards.

16. The machine tool of claim 15 wherein the plurality of main spindles are each journalled in a bearing sleeve, each bearing sleeve being releasably coupled to said spindle head by a clamping jaw so as to be displaceable relative thereto in Z-direction.

17. A method for preparing and adjusting the machine tool of claim 16, said method comprising the steps of:

lifting said spindle head;

releasing said bearing sleeves, wherein bearing sleaves are adjustably held in place by friction;

lowering the spindle head until all tools ride on plastic cards to be recessed, an upper surface of said cards defining a reference plane for a recess depth; and coupling said bearing sleeves to the spindle head.

* * * * *